US006111962A

United States Patent [19]

Akio

[11] Patent Number: 6,111,962

[45] Date of Patent: Aug. 29, 2000

[54] REVERBERATION SYSTEM

[75] Inventor: Takahashi Akio, Hamamatsu, Japan

[73] Assignee: Yamaha Corporation, Hamamatsu, Japan

[21] Appl. No.: 09/250,669

[22] Filed: Feb. 16, 1999

[30] Foreign Application Priority Data

Feb. 17, 1998 [JP] Japan .................................. 10-034650

[51] Int. Cl.[7] .......................................................... H03G 3/00

[52] U.S. Cl. ................................................ 381/63; 381/104

[58] Field of Search ................................ 381/63, 61, 104, 381/107, 1

[56] References Cited

U.S. PATENT DOCUMENTS

| | | | |
|---|---|---|---|
| 5,381,482 | 1/1995 | Matsumoto et al. | 381/63 |
| 5,384,856 | 1/1995 | Kyouno et al. | 381/63 |
| 5,452,360 | 9/1995 | Yamashita et al. . | |

FOREIGN PATENT DOCUMENTS 2569872 11/1991 Japan .

*Primary Examiner*—Minsun Oh Harvey
*Attorney, Agent, or Firm*—Pillsbury Madison & Sutro LLP

[57] ABSTRACT

A reverberation system produces reverberant sound supposed to be generated when sound emitted from a real sound source location inside a virtual acoustic room to be simulated is reflected by virtual room partitions surrounding the same, based on a set of stored impulse responses of reverberant sound actually or virtually observed at different observation positions in the vicinity of room partitions defining an actual or virtual model acoustic room. Digital filters each convolute a source signal representing the emitted sound, using coefficient parameters representing the corresponding stored impulse response, to thereby synthesize a virtual reverberant sound signal at each of simulation positions corresponding to the observation positions. Signal delay devices each delay the output of the corresponding digital filter, by a signal delay time controlled by a time delay setting device to thereby equivalently move the virtual room partition(s) of the virtual acoustic room relative to the real sound source location, and hence virtually change the virtual acoustic room into a desired shape.

7 Claims, 9 Drawing Sheets

REVERBERATION SYSTEM

BACKGROUND OF THE INVENTION

1. Field of the Invention

The present invention generally relates to a reverberation system for imparting reverberant sound to real sound from a real sound source location, which reverberant sound is produced within a virtual acoustic room that is surrounded by virtual walls and ceiling (that will be collectively called "virtual room partitions") that are assumed to be present at locations where no actual walls or ceiling exist, as if the sound from the real sound source was reflected by the virtual room partitions. In particular, this invention is concerned with such a reverberation system that is able to change the shape of the virtual acoustic room as desired, by changing the location of the virtual room partitions.

2. Prior Art

In outdoor concert halls, seats for audience are not surrounded by walls and ceiling that would be present in the case of indoor concert halls, and, therefore, no reverberation effect arises from reflected sound as produced in indoor halls unless the outdoor halls are designed otherwise. A known reverberation system images a virtual hall surrounded by virtual walls that are assumed to be present at locations of such an outdoor concert hall where no walls, ceiling, or the like, actually exist, and creates reflected sound in the virtual hall as if sound from a real sound source location were reflected by the virtual walls. The reverberation system may also be utilized when imaging a virtual hall of a small volume or capacity within an indoor hall of a large volume or capacity. This type of reverberation system generally includes a main loudspeaker that generates sound from a real sound source location, a plurality of sub-loudspeakers for producing reverberation or reverberant sound, which are arranged, at some intervals, around the virtual walls that define the virtual hall including the real sound source location, and a virtual reverberant sound synthesizer for synthesizing or producing virtual reverberant sound signals based on which reflected sounds are generated from the sub-loudspeakers as if the sound from the real sound source location were reflected by the virtual walls.

A specific example of the reverberation system as disclosed in Japanese Patent No. 2569872 was developed based on a fundamental concept as follows. In an actual hall 200 as shown in FIG. 1, sound generated from a real sound source 134 travels the shortest distance to reach a sound receiving point 136 as direct sound 150 and also reaches the sound receiving point 136 after being reflected once or a plurality of times by walls 138. An imaginary sound source 140 is assumed to be located at a point at which an extension of a line connecting the sound receiving point 136 and the final reflection point of the reflected sound 160 that reaches the sound receiving point 136 intersects with an extension plane of the rear wall including the rear sound source 134, and this imaginary sound source 140 is recognized as if it generated the reflected sound 160 as a direct sound. In the example of FIG. 1, reference numerals 140-1, 140-2, . . . denote a plurality of imaginary sound sources, and the reverberant sound structure (impulse response) as observed at the sound receiving point 136 is determined depending upon the positions of these imaginary sound sources.

In a virtual hall 300 as shown in FIG. 2, on the other hand, no physical wall really exists, but instead a virtual wall 138' is assumed to cause reflection of sound. To construct a virtual hall 300 through simulation, sub-loudspeakers 144-1, 144-2, . . . are positioned at some intervals so as to generate individually synthesized, virtual reverberant sounds, from a plurality of simulation positions in the vicinity of the virtual wall 138', and are each oriented in a direction in which the reflected sound is reflected.

The virtual reflected sound 170 emitted from each sub-loudspeaker 144 as described above is synthesized through digital processing. More specifically, the digital processing is performed using a plurality of digital filters, more particularly, non-recursive FIR (Finite Impulse Response) filters, each of which incorporates reflected sound parameters (time delay, amplitude and others) having a reflected sound structure of an impulse response that is almost identical with an impulse response observed at each of the above simulation positions (or obtained by computing based on CAD data or the like). A source signal corresponding to the sound emitted from the real sound source is fed to each of these filters, to be processed according to a convolution algorithm using the reflected sound parameters, to thereby produce virtual reverberant sound signals for the respective simulation positions.

The above-described system as disclosed in Japanese Patent No. 2569872 solves a problem of previously available reverberation systems that the optimum sound receiving point is theoretically limited to a single point (namely, the reflected sound structure is determined assuming only one sound receiving point), by providing a system arrangement capable of securing a wide sound receiving area. The basic concept of the disclosed system resides in that the reflected sound from one imaginary sound source 140 is reproduced from a plurality of loudspeaker devices 144-1, 144-2, . . . with time differences and level differences, and the reproduction is conducted with respect to each of a plurality of imaginary sound sources 140-1, 140-2, . . . .

In the above-described reverberation system of Japanese Patent No. 2569872, reflected sound parameters (impulse responses) assuming one virtual hall are incorporated in advance in each digital filter. It is, therefore, difficult to change reverberation characteristics to be simulated, according to the shape of a desired acoustic room (virtual hall). Since virtual acoustic rooms having different shapes possess different reverberation characteristics, the impulse responses to be adopted need to be re-measured for each shape of virtual acoustic room, or a plurality of sets of impulse responses that match or fit virtual acoustic rooms having typical shapes are prepared in advance, so that an appropriate set of impulse responses can be selectively used in accordance with the shape of a desired virtual hall. In either case, the system structure or arrangement is likely to be complicated. Where a large number of loudspeakers are used, in particular, the difficulty in changing the simulated reverberation characteristics is further increased.

SUMMARY OF THE INVENTION

The object of the present invention is to provide a reverberation system that is able to produce reverberation characteristics suited for a wide variety of virtual acoustic rooms, based on a single set of impulse responses, while assuring a sufficiently wide sound receiving area.

To attain the above object, the present invention provides a reverberation system comprising a storage device that stores a set of impulse responses of reverberant sound that are actually or virtually observed at a plurality of different observation positions in the vicinity of room partitions that define an actual or virtual model acoustic room, a reverberant sound producing device that produces reverberant sound that is supposed to be generated when sound emitted from a real sound source location inside a virtual acoustic room that is to be simulated, surrounded by virtual room partitions is reflected by the virtual room partitions, based on the impulse responses stored in the storage device, and a plurality of loudspeakers for producing reverberation, which are located at simulation positions that correspond to the plurality of different observation positions of the model acoustic room, the loudspeakers being oriented in directions in which the sound emitted from the real sound source location is reflected by the virtual room partitions, wherein the reverberant sound producing device comprises a plurality of digital filters each of which processes a source signal representing the sound emitted from the real sound source location, according to a convolution algorithm, using coefficient parameters representing a corresponding one of the impulse responses of reverberant sound stored in the storage device, to thereby synthesize a virtual reverberant sound signal at each of the simulation positions, a plurality of signal delay devices that are respectively arranged in series with the plurality of digital filters, each of the signal delay devices giving a signal delay time to an output of a corresponding one of the digital filters, and a delay time setting device that controls the signal delay time of the each signal delay device, to thereby equivalently move at least part of the virtual room partitions of the virtual acoustic room toward or away from the real sound source location, and thus virtually change a shape of the virtual acoustic room into a desired shape, and wherein the reverberant sound producing device synthesizes respective reflected sounds from a plurality of imaginary sound sources, based on the sound emitted from the real sound source location, the imaginary sound sources being assumed to be present around the virtual acoustic room according to a relationship between the actual sound source location and a position of the at least part of the virtual room partitions, so that the reflected sound from each of the imaginary sound sources is reproduced from each of the plurality of loudspeakers, with time differences and level differences, to thereby produce virtual reverberation signals for respective ones of the simulation positions, and supply the virtual reverberation signals to respective ones of the plurality of loudspeakers.

Preferably, the plurality of loudspeakers are respectively located at the simulation positions that are established in the vicinity of respective ones of the observation positions of the model acoustic room, and wherein the delay time setting device sets the signal delay time of each of the signal delay devices so that the virtual acoustic room differs from the model acoustic room.

Alternatively, the plurality of loudspeakers are respectively located at the simulation positions that are set to different positions from respective ones of the observation positions of the model acoustic room, and wherein the delay time setting device sets the signal delay time of each of the signal delay devices so that the virtual acoustic room is approximated to the model acoustic room.

Preferably, each of the signal delay devices provides an initial delay time as the signal delay time, which is a time duration between generation of direct sound of the source signal and generation of an initial reflected sound corresponding thereto.

Also preferably, in simulating the virtual acoustic room having a different shape from the model acoustic room in which the set of impulse responses of reverberant sound are measured, the delay time setting device adjusts the signal delay time of each of the signal delay devices in a positive direction or a negative direction, such that a maximum value of the signal delay time in the negative direction is set to zero, and an amount equal to a difference between the maximum value and zero is added to the signal delay time of each of the other signal delay devices.

More preferably, the reverberation system further comprises a main loudspeaker provided at the real sound source location, for reproducing the source signal, and a main signal delay device that delays the source signal to be fed to the main loudspeaker, wherein the main signal delay device delays the source signal by a maximum value of the signal delay time in a negative direction, so as to simulate the virtual acoustic room having a different shape from the model acoustic room in which the set of impulse responses of reverberant sound are measured.

Advantageously, the reverberant sound producing device further comprises a plurality of volumes for changing amplitude levels of the virtual reverberant sound signals, depending upon respective signal delay amounts of the signal delay devices.

In the reverberation system constructed according to the present invention, the plurality of digital filters are provided for synthesizing virtual reverberation signals at respective simulation positions, and the signal delay devices are arranged in series with the respective digital filters. Since the signal delay time of each signal delay device can be changed as desired by means of the delay time setting device, the virtual room partitions can be virtually moved toward or away from the real sound source location, whereby the shape of an acoustic room to be simulated can be changed as desired. According to the present invention, therefore, only one set of impulse responses are needed for providing reverberation characteristics that match a wide variety of acoustic rooms. Further, the construction of the present system is simplified since it is not necessary to re-measure or reset impulse responses for different types or shapes of acoustic rooms, and only one set of impulse responses need to be stored. Moreover, in the system according to the present invention, reflected sounds from one imaginary sound source are reproduced from the plurality of loudspeakers with time differences and level differences, and the reproduction is carried out with respect to a plurality of imaginary sound sources, thus assuring a sufficiently large sound receiving area.

The impulse responses of reverberant sound may be obtained through actual measurements using a real concert hall as a model acoustic room, or may be virtually obtained through computing, using CAD design data, or the like, of the hall.

The "simulation positions that correspond to the plurality of observation positions of the model acoustical field" as indicated above are to be interpreted as simulation positions having a one-to-one correspondence with the respective observation positions, and these simulation and observation positions are not necessarily identical with each other. Where the actual observation positions are close to the simulation positions at which the loudspeakers are located, the model acoustic room is reproduced as it is as a virtual acoustic room unless delay control is performed. If signal delay control is performed by the signal delay devices, however, it is possible to simulate an acoustic room having different size and shape from the model acoustic room.

Where the loudspeakers cannot be located at the actual observation positions due to a restriction to space, simulation positions are set to those positions different from the observation positions of the model acoustic room. In this case, too, it is possible to reproduce the model acoustic room through signal delay control of the signal delay devices.

Acoustic rooms having a wide variety of shapes, some of which are rather complicated, may be assumed or imaged in real situations. To apply a set of impulse responses to various virtual halls having different shapes from that of the acoustic room in which the impulse responses were measured, the time delay amounts of virtual reflected sounds generated from respective loudspeakers need to be individually adjusted in a positive direction or a negative direction. In reality, it is difficult to drive the circuit so as to delay an input signal in the negative direction, namely, advance the signal, and therefore the following methods may be equivalently employed to accomplish desired adjustment of the delay amounts.

In a first preferred form of the invention, signal delay times of the plural signal delay devices are respectively adjusted in a positive or negative direction, by setting the maximum value of signal delay time in the negative direction to zero, and adding a difference between the maximum delay value and zero to the other signal delay times. With this arrangement, relative relationships among the delay times of reverberant sound generated from respective loudspeakers can be maintained as originally determined, and therefore an atmosphere of a desired acoustic room can be satisfactorily created.

In the above-described form, however, the resulting acoustic room tends to expand to larger dimensions than desired or design values. In a second preferred form of the invention, therefore, a main signal delay device is provided for delaying a source signal that is supplied to a main loudspeaker located at the real sound source position for reproducing the source signal, and the main signal delay device is used for delaying the source signal by the maximum value of the signal delay time in the negative direction. In this manner, the acoustic room or field can be formed with desired or intended dimensions.

Each of the signal delay devices preferably provides an initial delay time as the signal delay time, which initial delay time is a time duration between generation of direct sound of the source signal and generation of a corresponding initial reflected sound.

The above and other objects, features, and advantages of the invention will become more apparent from the following detailed description taken in conjunction with the accompanying drawings.

DETAILED DESCRIPTION

The present invention will be described in detail with reference to the drawings showing a preferred embodiment thereof.

Figure 1:
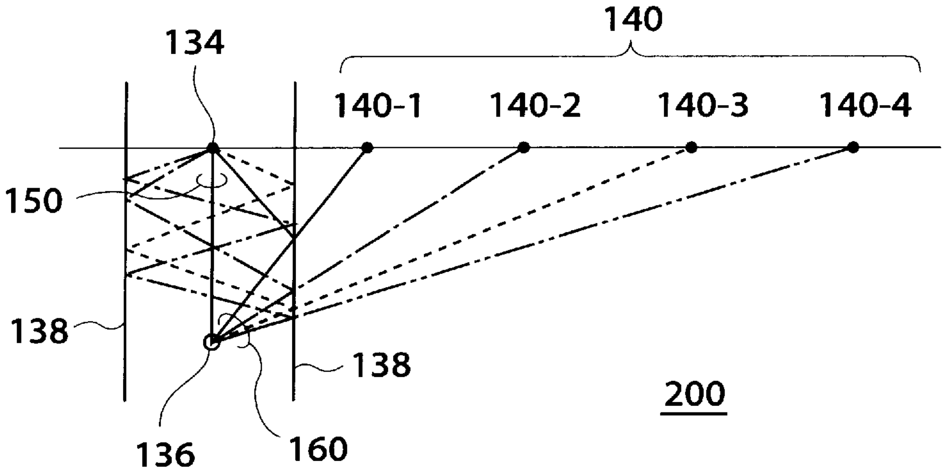
FIG.1 PRIOR ART
FIG. 1 is a view useful in explaining acoustic characteristics of an actual concert hall.
Figure 2:
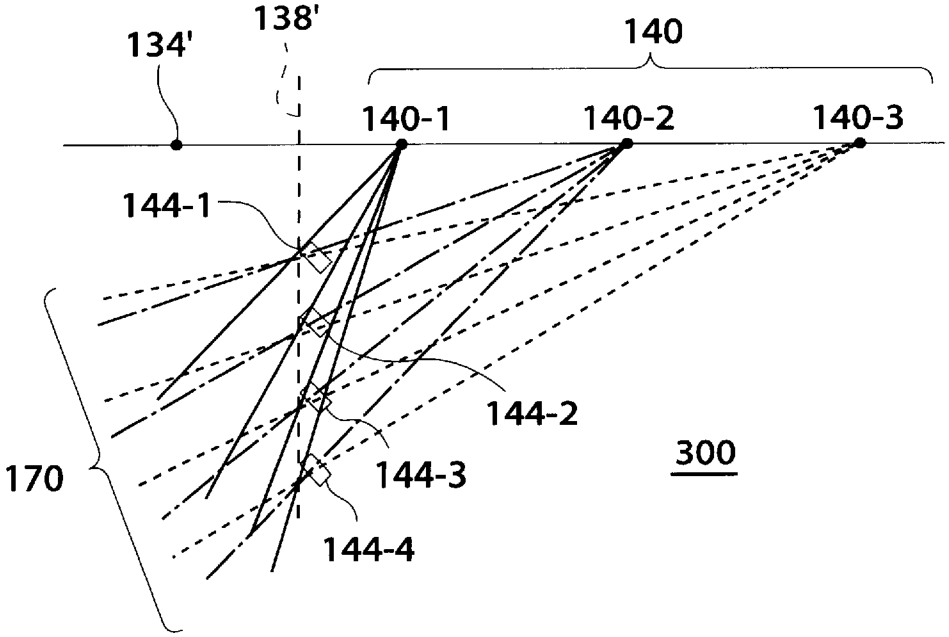
FIG.2 PRIOR ART
FIG. 2 is a view useful in explaining a conventional method of establishing a virtual hall.
Figure 3:
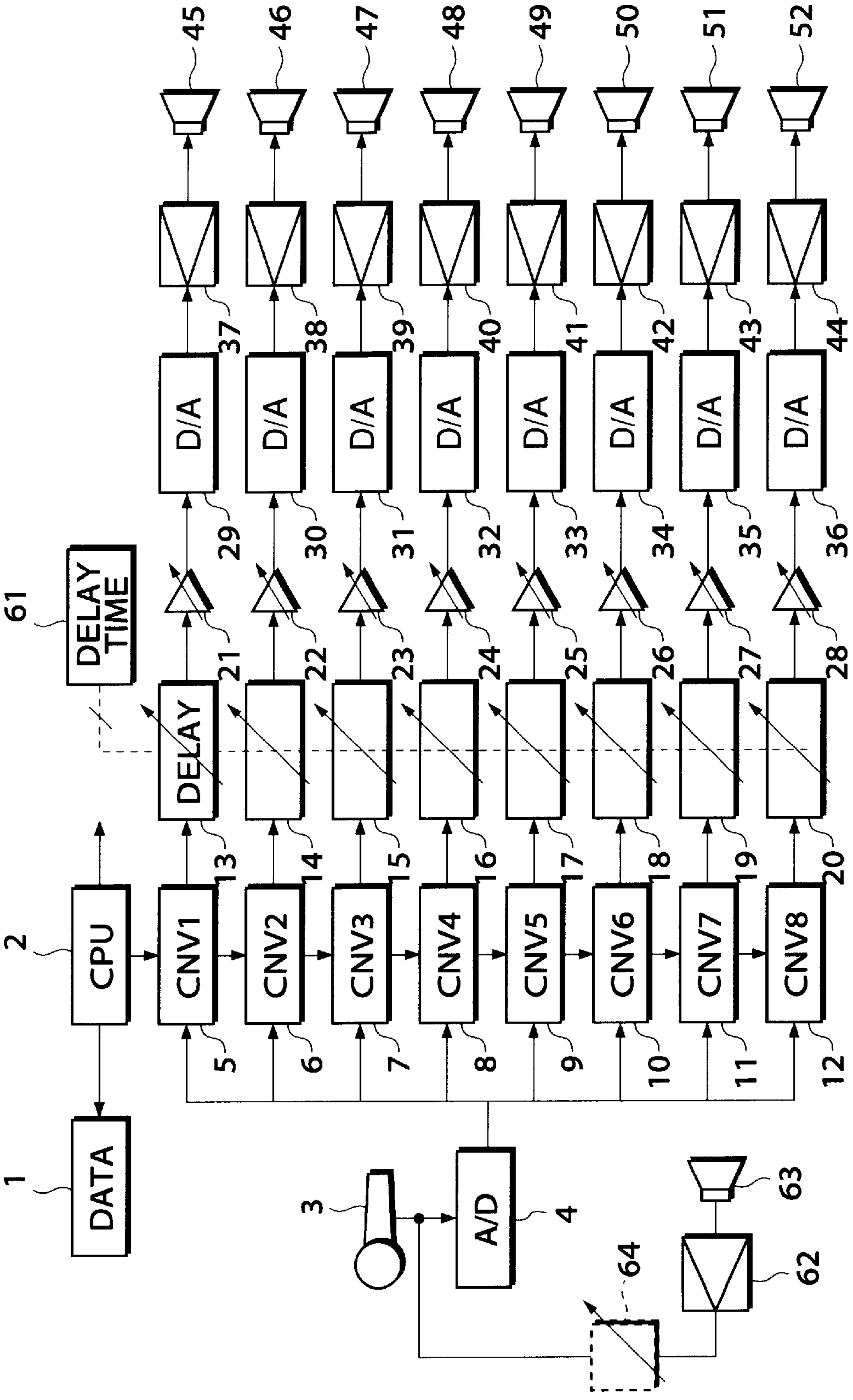
FIG. 3 is a block diagram showing the construction of a reverberation system according to an embodiment of the present invention.

FIG. 3 shows the construction of a reverberation system according an embodiment of the present invention. In FIG. 3, a storage unit 1 stores data used for producing reverberant sound, namely, coefficient parameters (impulse responses) for use in digital filters that will be described later. A CPU 2 reads out the coefficient parameters stored in the storage unit 1, and supplies the parameters to digital filters (CNV1–CNV8) 5–12 that perform convolution operations for respective loudspeakers. The CPU 2 also executes control programs for adjusting delay time and volume as described later. A microphone 3 is positioned at a real sound source location on a stage, and an A/D converter 4 converts an analog voice signal received through the microphone 3, into a corresponding digital signal.

The signal supplied from the A/D converter 4, namely, digital signal (source signal) of sound generated from the real sound source (microphone 3), is supplied to the digital filters 5–12, and processed according to a convolution algorithm using the coefficient parameters supplied from the CPU 2, so that virtual reverberation signals are produced. The outputs (virtual reverberation signals) of the digital filters 5–12 are then supplied to respective signal delay circuits 13–20. The signal delay circuits 13–20 serve to delay the virtual reverberation signals, respectively, by finite lengths of time that are set as desired by a delay time setting circuit 61. To provide the signal delay circuits 13–20, tone control devices, which are generally called "effect devices", may be used. While the tone control device incorporates LPF function, HPF function, BPF function, and others, the present invention focuses attention on the signal delay function, out of these functions, and utilizes this function for adjusting the initial delay time of reverberant sound as described later. The delayed virtual reverberation signals output from the signal delay circuits 13–20 are respectively supplied to volumes 21–28, where the levels of the signals are adjusted under control of the CPU 2. The virtual reverberation signals whose levels have thus been adjusted are then fed to D/A converters 29–36, where the digital signals are converted into analog signals, and the analog signals thus obtained are amplified by respective amplifiers 37–44, and generated through sub-loudspeakers 45–52 for producing reverberation. Thus, the storage unit 1, CPU 2, A/D converter 4, digital filters 5–12, signal delay circuits 13–20, volumes 21–28, D/A converters 29–36, amplifiers 37–44, and the delay time setting circuit 61, described above, constitute a virtual reverberant sound synthesizing device of the present invention.

Figure 5:
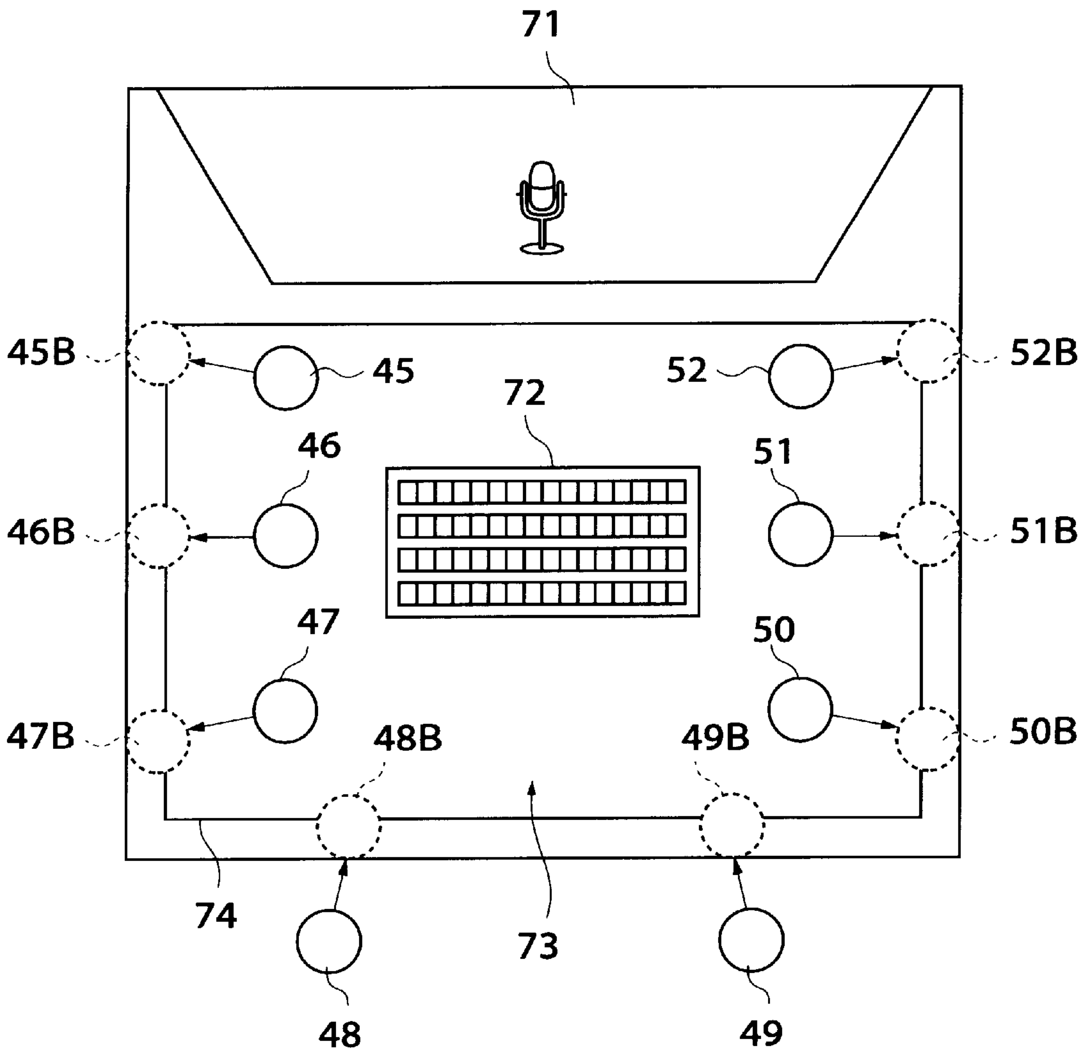
FIG. 5 is a view showing a simple example of virtual hall.

In the meantime, the analog signal received from microphone 3 is amplified by an amplifier 62, and generated from a source reproduction main loudspeaker 63 that is placed in the vicinity of the real sound source location. If necessary, a signal delay circuit 64 for delaying the signal, as described later, may be inserted between the microphone 3 and the amplifier 62. As shown in FIG. 5, the sub-loudspeakers 45–52 for producing reverberation are installed at respective positions 45B–52B that are identical with or different from actual observation positions. These positions 45B–52B will be called “simulation positions”. By generating reverberant sounds from the simulation positions, a virtual hall 73 in which seats 72 for audience are surrounded by virtual walls 74 is simulated in front of the real sound source location (where the microphone 3 is placed on the stage 71).

Figure 4:
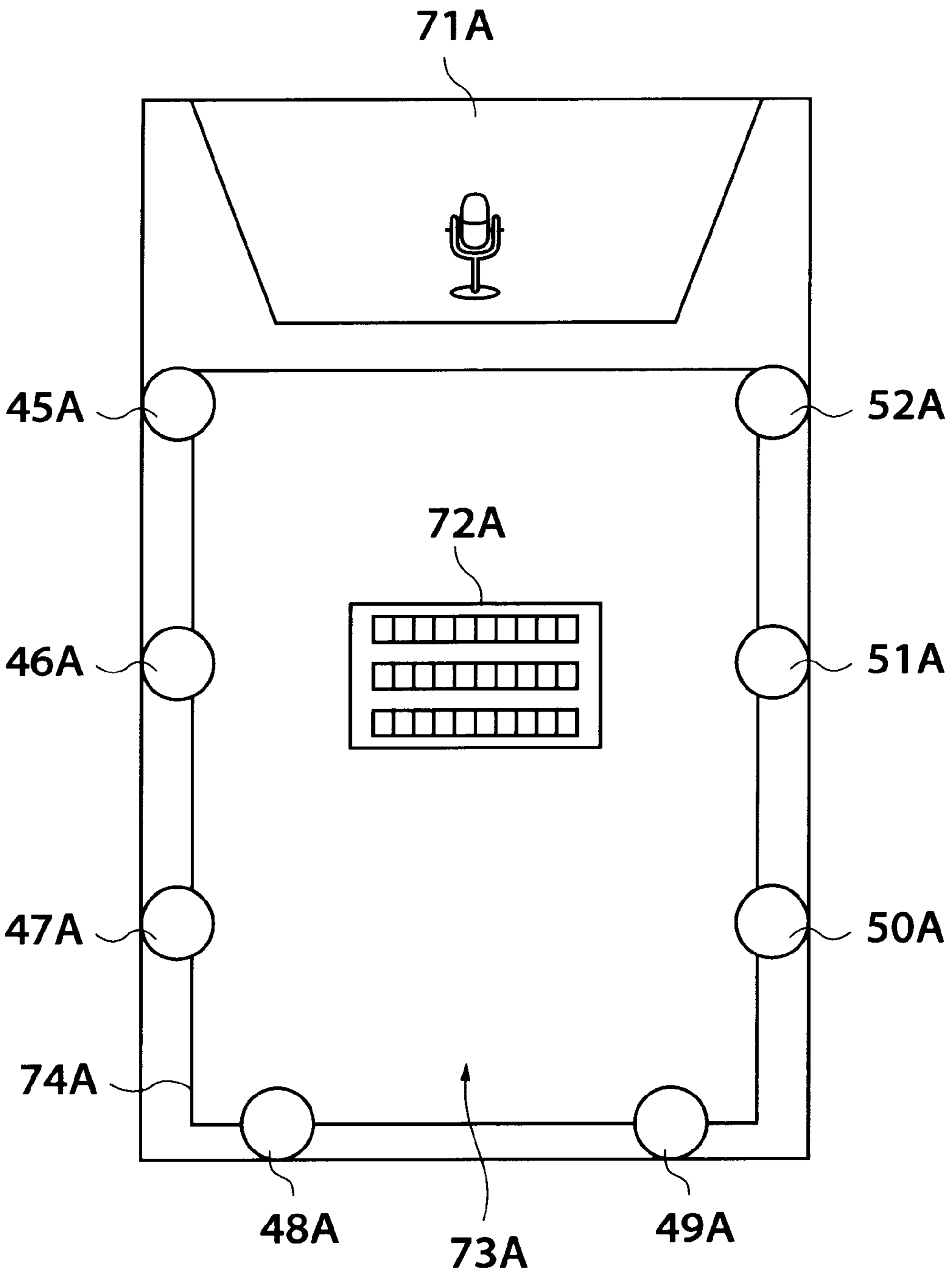
Fig.4 is a view useful in explaining a method of measuring reflected sound in an actual hall.
Figure 6A:
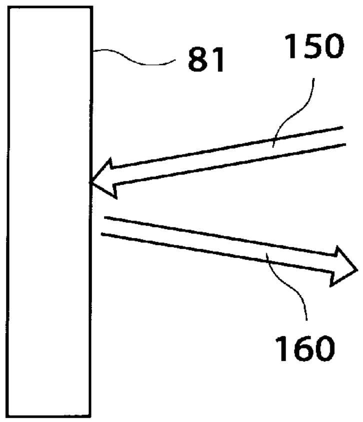
FIG. 6A is a view showing a manner in which direct sound from a real sound source is reflected by a wall of an actual hall.
Figure 6B:
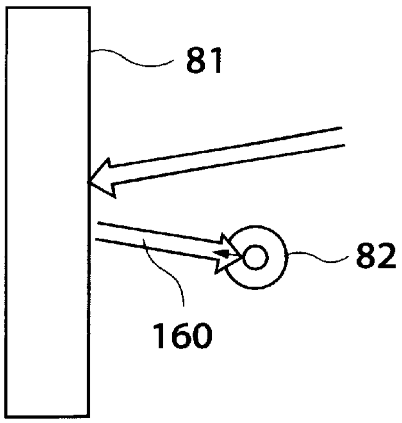
FIG. 6B is a view useful in explaining a method of measuring the reflected sound of FIG. 6A.
Figure 6C:
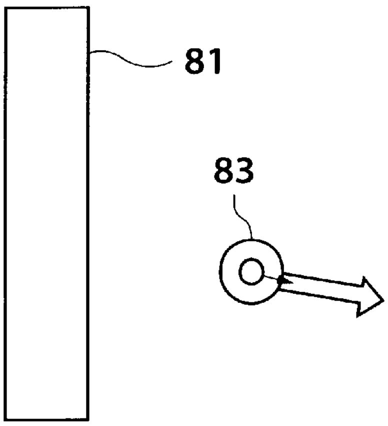
FIG. 6C is a view useful in explaining a method of producing reflected sound.
Figure 7A:
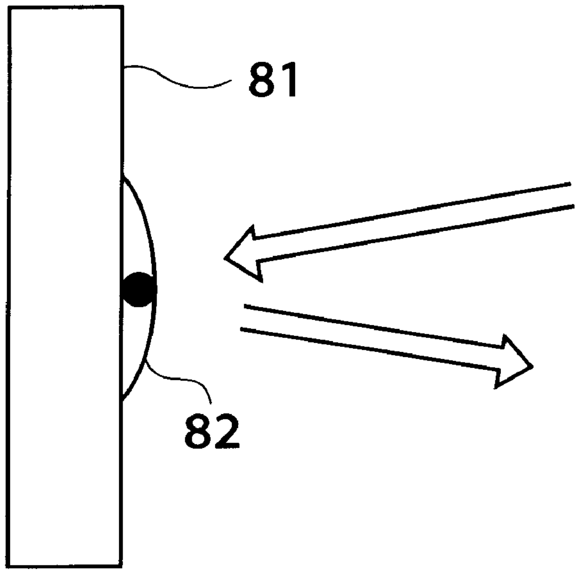
FIG. 7A is a view useful in explaining another method of measuring reflected sound.
Figure 7B:
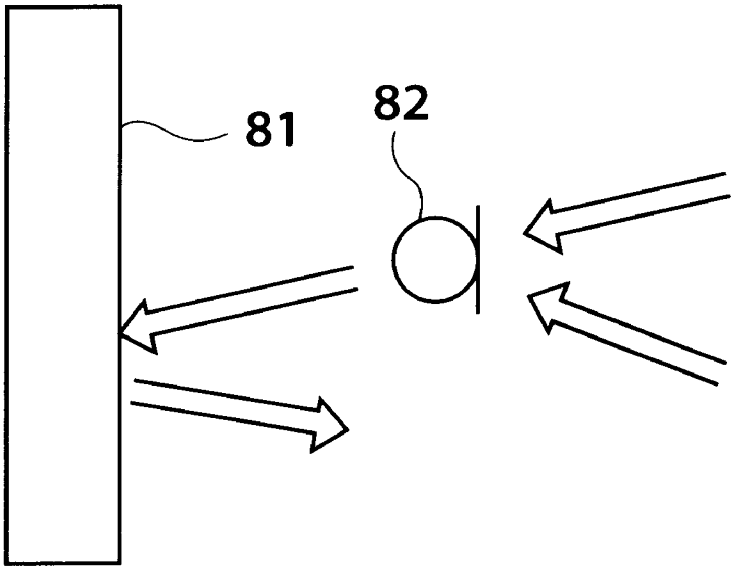
FIG. 7B is a view useful in explaining a further method of measuring reflected sound.

FIG. 4 is a view useful in explaining the case where reflected sound is measured in an actual hall (model acoustic room). In this case, a plurality of reflected sound measurement points 45A–52A are set or established along walls 74A that physically exist and define an actual hall 73A that surrounds seats 72A in front of a stage 71A on which the real sound source location is set. The measurement of reflected sound in the actual hall, and production of reverberant sound for a virtual hall (virtual acoustic room) based on the measurement result will be described referring to FIGS. 6A–6C. FIG. 6A illustrates the manner in which direct sound 150 from a real sound source (or sound already reflected by a wall) is reflected by an actual wall 81. The reflected sound 160 from the wall 81 is measured by a sound receiver (microphone) 82 that is installed at a position spaced apart from the wall 81, as shown in FIG. 6B. Subsequently, a loudspeaker 83 is placed at the same position as the microphone 82, as shown in FIG. 6C, such that the loudspeaker 83 is oriented in the same direction as the reflected sound. Even in the absence of the actual wall 81, the loudspeaker 82 located in the above manner is able to create reverberant sound as if the wall 81 existed at the position shown in FIG. 6C. While the above description concerns only one reflected sound for the sake of brevity, a plurality of reflected sounds are serially generated on the wall 81 in real situations. The manner of generation of reflected sounds is different from one wall to another. For the purpose of measuring reflected sound, the direct sound may be directly measured by a sound receiver (boundary microphone) 82 that is installed on the wall 81, as shown in FIG. 7A, or may be directly measured by a sound receiver 82 that is located at a position spaced apart from the wall 81, as shown in FIG. 7B. With these arrangements for measurement, an impulse response at each measurement point can be observed.

If the sub-loudspeakers 45–52 for producing reverberant sound are located at exactly the same positions as the respective measurement points 45A–52A in a hall that is different from the actual hall of FIG. 4 in which reflected sounds were measured, or in an outdoor hall, and the signal delay circuits 13–20 function to delay input signals with substantially the same delay times as actually measured, a virtual hall that is similar to the actual hall in which the reflected sounds were measured can be reproduced. Suppose it is desired to create a virtual hall having relatively large width and small depth as shown in FIG. 5, which is different from the actual hall of FIG. 4 having relatively small width and large depth, with the sub-loudspeakers 45–52 located at exactly the same positions as described above. To create such a virtual hall, reverberant sounds from the sub-loudspeakers 45, 25 46, 47 and 50, 51, 52 located at the left-side and right-side portions of the virtual hall 73 of FIG. 5, respectively, are generated with delays that are larger than actual measurement values, and reverberant sounds from the loudspeakers 48, 49 located at the rear end of the virtual hall 73 are generated with delays that are smaller than the measurement values. In this manner, the left and right virtual walls 74 of the virtual hall 73 move backward, and the rear virtual wall 74 moves forward, so that the virtual hall 73 is designed with a larger width and a smaller depth than the hall 73A in which the reflected sounds were measured. Thus, reverberation can be produced in any type of virtual hall 73, only by adjusting the delay time.

Where it is desired to reproduce the hall 73A of FIG. 4, based on the impulse responses observed in the hall 73A of FIG. 4, with the sub-loudspeakers 45–52 located at the positions 45B–52B in FIG. 5, the delay time setting circuit 61 is set to operate the signal delay circuits 13–20, so that the delay times of reverberant sounds from the left and right sub-loudspeakers 45–47 and 50–52 are made smaller than delay amounts obtained by actual measurements, and the delay times of reverberant sounds from the rear sub-loudspeakers 48, 49 are made larger than the measured delay amounts. Although the virtual acoustic room is considered as a plane in the above description, for the same of brevity, the actual acoustic room is defined by a three-dimensional structure including a ceiling and a floor in addition to side walls, as reflecting surfaces, and the reflection in this room takes place three-dimensionally in a more complicated manner. In any event, the present invention aims at producing reverberant sound that matches any type of virtual halls (acoustical rooms) having a wide variety of shapes, based on a single set of impulse response data associated with reflected sounds measured in one model room as shown in FIG. 4.

Figure 8A:
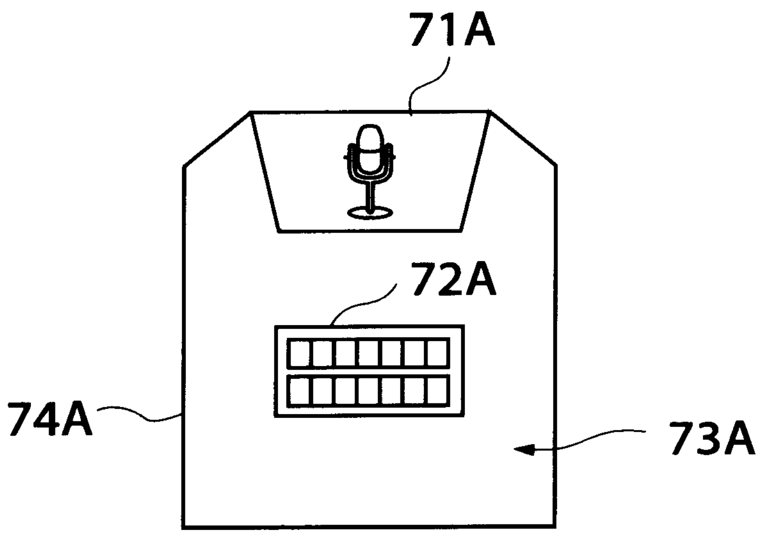
FIG. 8A is a view showing one example of actual hall in which impulse responses used for producing reverberant sound are measured.
Figure 8B:
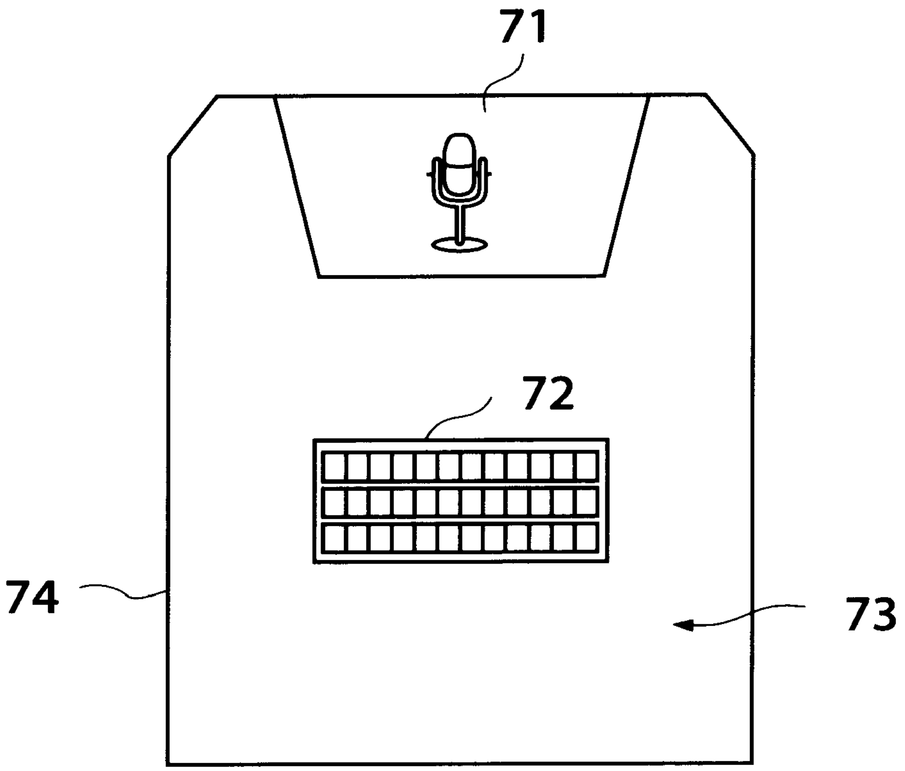
FIG. 8B is a view showing a virtual hall that is simulated based on the impulse responses measured in FIG. 8A.
Figure 9A:
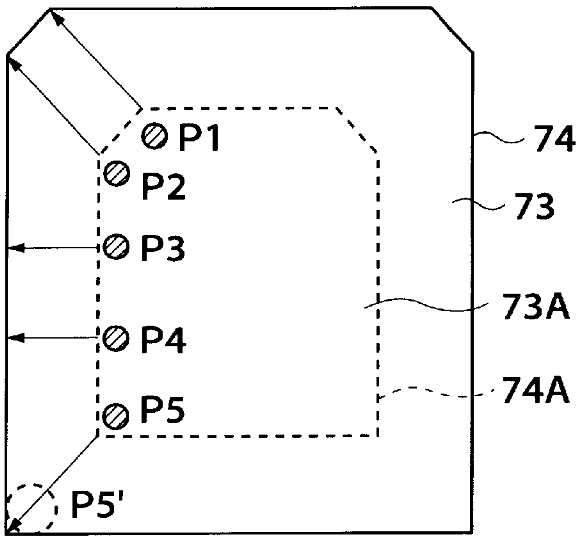
FIG. 9A is a view showing the actual hall of FIG. 8A and the virtual hall of FIG. 8B superposed on each other.
Figure 9B:
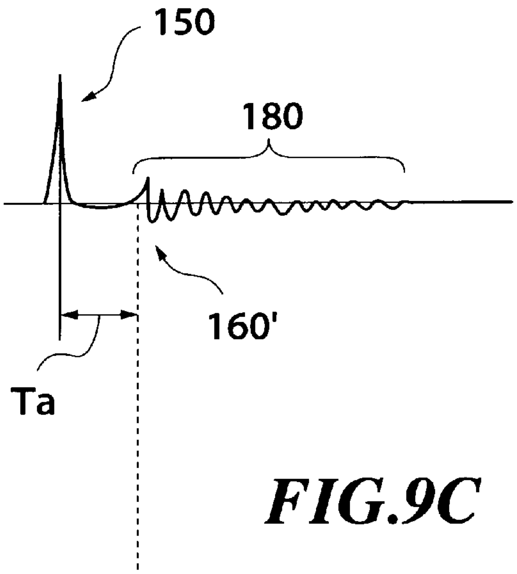
FIG. 9B is a view showing one example of impulse response measured at a certain measurement point.
Figure 9C:
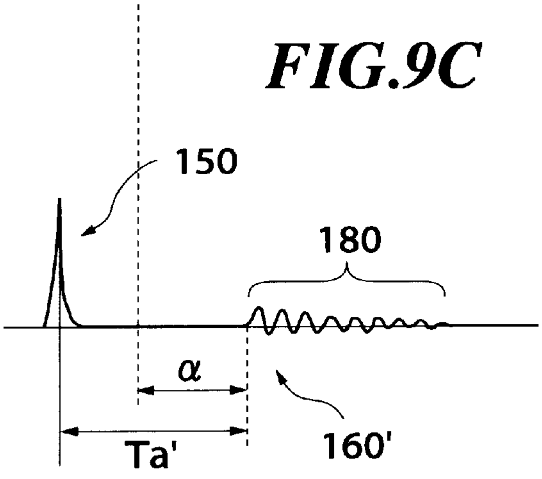
FIG. 9C is a view showing an impulse response to be produced at a measurement point in a virtual hall that corresponds to the measurement point of FIG. 9B.

A method of determining how much delay should be added to direct sound in accordance with a desired virtual hall will be now described. FIG. 8A illustrates an actual hall in which the impulse responses for producing reverberant sounds are measured, and FIG. 8B illustrates a virtual hall that is simulated based on the impulse responses measured in the actual hall, while FIG. 9A shows the actual hall 73A of FIG. 8A and the virtual hall 73 of FIG. 8B in a manner being superposed on each other. In FIG. 9A, points P1, P2, . . . , P5 indicated along the wall 74A of the actual hall 73A represent a plurality of measurement points. As shown in FIG. 9B showing an impulse response that is measured at point P5 as one of the measurement points, initial reflected sound 160 is generated upon a lapse of an initial delay time Ta after occurrence of direct sound 150, followed by attenuation of the initial reflected sound 160, or reverberation 180. A change in the initial delay time Ta through signal delay processing is considered to be equivalent to a change in the distance between the real sound source location and the relevant wall. If the amplitude level of reverberant sound is adjusted by means of a corresponding one of the volumes 21–28 at the same time that the initial delay time is changed, so that the amplitude level is reduced with an increase in the delay, or increased with a decrease in the delay, the reproduction accuracy is further improved, namely, the desired virtual hall can be created with improved accuracy. FIG. 9C shows an impulse response that is to be produced at point P5'

(FIG. 9A) on the virtual wall 74 of the virtual hall 73, which corresponds to the measurement point P5 on the wall 74A of the actual hall 73A. It will be understood from FIG. 9C that the initial delay time Ta' is increased by an amount proportional to an increase in the distance from the real sound source location to the point P5', as compared with the distance to the point P5, and the amplitude of the reflected sound is accordingly reduced. While the impulse response of FIG. 9C is obtained by shifting the whole reverberation to a later period on the time axis, the increase in the initial delay time Ta' would be predominantly perceived as if the wall itself was retracted rearwards with an increased distance from the real sound source location. According to the present invention, such changes in the initial delay time Ta' can be easily accomplished by means of the time delay circuits 13–20, rather than the digital filters of FIG. 3.

Figure 10:
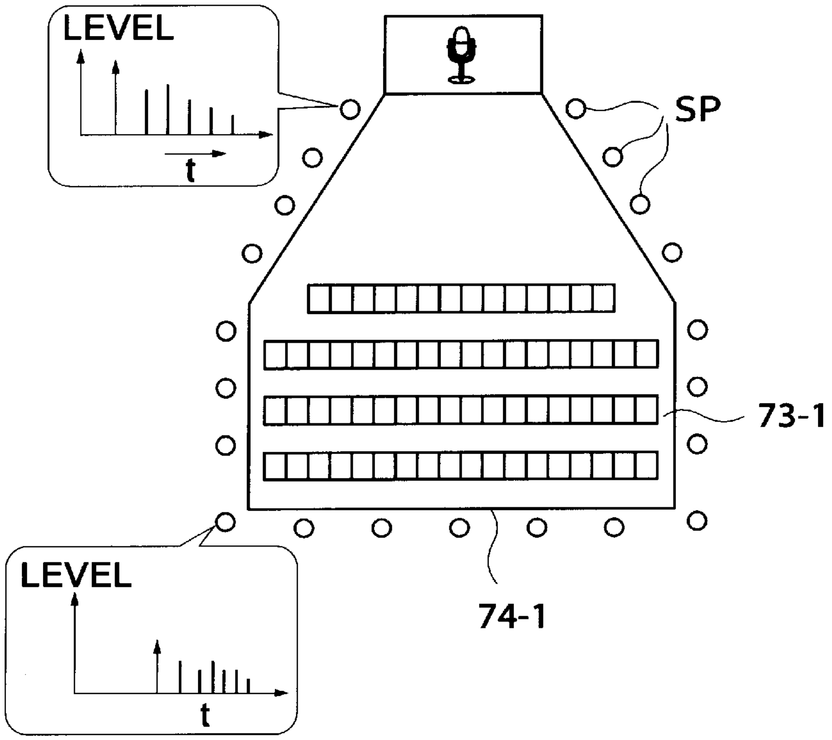
FIG. 10 is a view showing one example of virtual hall having a modified hexagonal shape close to the shape of an actual hall.
Figure 11:
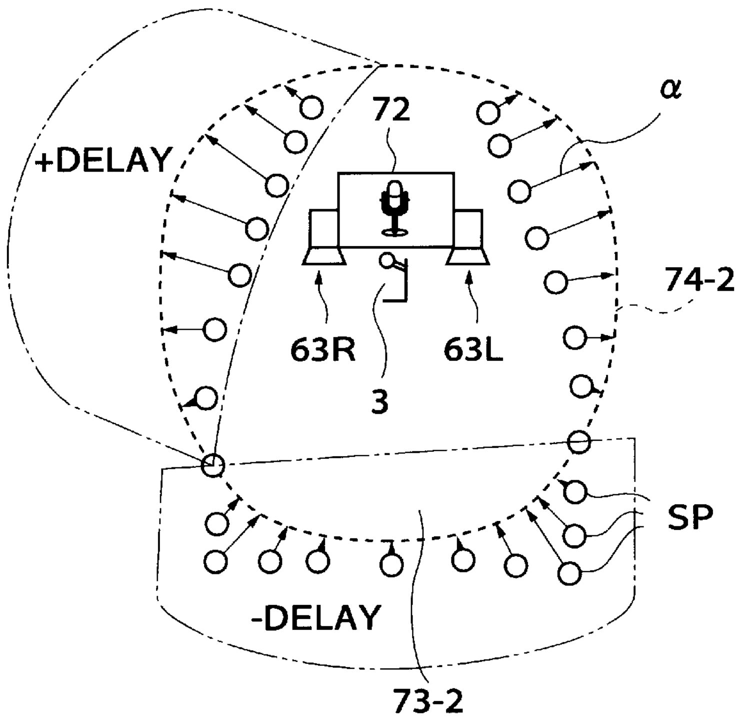
FIG. 11 is a view showing one example of a circular virtual hall that is simulated by changing delay amounts of reverberant sound generated from loudspeakers placed in the virtual hall of FIG. 10.

FIG. 10 and FIG. 11 illustrate examples in which the shape of the virtual hall is changed as desired, into more complicated shapes. In the example of FIG. 10, a multiplicity of sub-loudspeakers SP for producing reverberation are positioned in the same manner as described above, along virtual walls 74-1 of an actual or virtual model hall 72 having a modified hexagonal shape. To create a circular virtual hall 73-2 as shown in FIG. 11, with the sub-loudspeakers SP located in the same positions, a positive (+) or negative (−) amount of delay is added to the initial delay time of reverberant sound from each sub-loudspeaker SP, so as to correct the delay time in view of a difference in the shape between the virtual halls 73-1 and 73-2. In FIG. 11, the delay amount α a for each loudspeaker SP is represented by the length of a corresponding arrow. The positive (+) and negative (−) signs of the delay amounts indicate a lag and a lead in time, respectively, which may be considered as relative relationships among the delay amounts. For example, the maximum value of the negative (−) delay may be set to zero delay, and the other delay amounts may be increased by a difference between the maximum delay value and zero. This also makes it possible to create an atmosphere in which the shape of the acoustic room has been changed enough. In this case, however, the acoustic room tends to expand to greater dimensions than desired values. To improve this point, a main reproduction system (left and right main PA loudspeakers 63R, 63L) for reproducing the source signal may be controlled by the time delay circuit 64 of FIG. 3, so that sound represented by the source signal is generated with the maximum value of negative (−) delay, to thereby provide an acoustic room having desired dimensions.

In the system of the present embodiment, the shape of the virtual hall is changed by adjusting the initial delay time of virtual reflected sound by means of the time delay circuits 13–20 of FIG. 3. Although the same function may be accomplished by means of the digital filters 5–12, the use of the digital filters 5–12 for this purpose will require multiple sets of impulse response data to be prepared for all different types or shapes of halls. In this respect, the present reverberation system only requires one set of impulse response data to be prepared, which leads to simplified construction of the system. Also, the control scheme of the present system is simple and self-explanatory, and thus can be easily designed. Furthermore, the system of the present invention produces virtual reverberant sound, such that reflected sound from a single imaginary sound source is reproduced by a plurality of sub-loudspeakers, with certain time differences and level differences, and such that the reproduction is carried out with respect to a plurality of imaginary sound sources, thus assuring a sufficiently large sound receiving area.

What is claimed is:

1. A reverberation system comprising:

a storage device that stores a set of impulse responses of reverberant sound that are actually or virtually observed at a plurality of different observation positions in the vicinity of room partitions that define an actual or virtual model acoustic room;

a reverberant sound producing device that produces reverberant sound that is supposed to be generated when sound emitted from a real sound source location inside a virtual acoustic room that is to be simulated, surrounded by virtual room partitions is reflected by the virtual room partitions, based on the impulse responses stored in said storage device; and a plurality of loudspeakers for producing reverberation, which are located at simulation positions that correspond to said plurality of different observation positions of said model acoustic room, said loudspeakers being oriented in directions in which the sound emitted from the real sound source location is reflected by said virtual room partitions, wherein said reverberant sound producing device comprises:

a plurality of digital filters each of which processes a source signal representing the sound emitted from the real sound source location, according to a convolution algorithm, using coefficient parameters representing a corresponding one of the impulse responses of reverberant sound stored in said storage device, to thereby synthesize a virtual reverberant sound signal at each of said simulation positions;

a plurality of signal delay devices that are respectively arranged in series with said plurality of digital filters, each of said signal delay devices giving a signal delay time to an output of a corresponding one of said digital filters; and a delay time setting device that controls the signal delay time of said each signal delay device, to thereby equivalently move at least part of the virtual room partitions of the virtual acoustic room toward or away from the real sound source location, and thus virtually change a shape of the virtual acoustic room into a desired shape, and wherein said reverberant sound producing device synthesizes respective reflected sounds from a plurality of imaginary sound sources, based on the sound emitted from the real sound source location, said imaginary sound sources being assumed to be present around the virtual acoustic room according to a relationship between the actual sound source location and a position of the at least part of the virtual room partitions, so that the reflected sound from each of the imaginary sound sources is reproduced from each of said plurality of loudspeakers, with time differences and level differences, to thereby produce virtual reverberation signals for respective ones of the simulation positions, and supply the virtual reverberation signals to respective ones of said plurality of loudspeakers.

2. A reverberation system as defined in claim 1, wherein said plurality of loudspeakers are respectively located at the simulation positions that are established in the vicinity of respective ones of the observation positions of the model acoustic room, and wherein said delay time setting device sets the signal delay time of each of said signal delay devices so that said virtual acoustic room differs from said model acoustic room.

3. A reverberation system as defined in claim 1, wherein said plurality of loudspeakers are respectively located at the simulation positions that are set to different positions from respective ones of the observation positions of the model acoustic room, and wherein said delay time setting device sets the signal delay time of each of said signal delay devices so that said virtual acoustic room is approximated to said model acoustic room.

4. A reverberation system as defined in claim 1, wherein each of said signal delay devices provides an initial delay time as said signal delay time, which is a time duration between generation of direct sound of said source signal and generation of an initial reflected sound corresponding thereto.

5. A reverberation system as defined in claim 2, wherein, in simulating the virtual acoustic room having a different shape from the model acoustic room in which said set of impulse responses of reverberant sound are measured, said delay time setting device adjusts the signal delay time of each of said signal delay devices in a positive direction or a negative direction, such that a maximum value of the signal delay time in the negative direction is set to zero, and an amount equal to a difference between the maximum value and zero is added to the signal delay time of each of the other signal delay devices.

6. A reverberation system as defined in claim 2, further comprising:

a main loudspeaker provided at the real sound source location, for reproducing said source signal; and a main signal delay device that delays the source signal to be fed to said main loudspeaker, wherein said main signal delay device delays the source signal by a maximum value of the signal delay time in a negative direction, so as to simulate the virtual acoustic room having a different shape from the model acoustic room in which said set of impulse responses of reverberant sound are measured.

7. A reverberation system as defined in claim 1, wherein said reverberant sound producing device further comprises a plurality of volumes for changing amplitude levels of the virtual reverberant sound signals, depending upon respective signal delay amounts of said signal delay devices.

* * * * *